United States Patent [19]

Yamamoto

[11] Patent Number: 4,939,743
[45] Date of Patent: Jul. 3, 1990

[54] SEMICONDUCTOR LASER DEVICE
[75] Inventor: Saburo Yamamoto, Nara, Japan
[73] Assignee: Sharp Kabushiki Kaisha, Osaka, Japan
[21] Appl. No.: 354,254
[22] Filed: May 18, 1989
[30] Foreign Application Priority Data May 18, 1988 [JP] Japan .................................. 63-121561

[51] Int. Cl.⁵ .............................................. H01S 3/19
[52] U.S. Cl. ........................................ 372/46; 372/48; 372/45
[58] Field of Search ...................... 372/46, 48, 45, 44, 372/43; 357/16, 17

[56] References Cited

U.S. PATENT DOCUMENTS 4,326,176 4/1982 Aiki et al. ............................. 372/46
4,592,060 5/1986 Hayakawa et al. ................... 372/48

FOREIGN PATENT DOCUMENTS

| 52-40958 | 3/1977 | Japan . | |
|---|---|---|---|
| 52-41107 | 3/1977 | Japan . | |
| 52-48066 | 4/1977 | Japan . | |
| 54-5273 | 1/1979 | Japan . | |
| 0154792 | 12/1980 | Japan ..................................... | 372/46 |
| 0095689 | 6/1982 | Japan ..................................... | 372/43 |
| 0074386 | 4/1986 | Japan ..................................... | 372/43 |
| 62-2718 | 1/1987 | Japan . | |
| 62-7719 | 2/1987 | Japan . | |

Primary Examiner—William L. Sikes
Assistant Examiner—Georgia Y. Epps
Attorney, Agent, or Firm—Irell & Manella

[57] ABSTRACT

A semiconductor laser device comprising an active layer sandwiched between a first semiconductor layer and a second semiconductor layer, the forbidden bandgap of each of said first and second layers being larger than that of said active layer, wherein at least one of said first and second layers has a striped projection provided with two inclined surfaces; said layer is sandwiched between said active layer and a light absorption layer; and the thickness of said layer that corresponds to the inside of the center area of each of the two inclined surfaces is thick enough so that laser light cannot permeate into said absorption layer and the thickness of said layer that corresponds to the outside of the center area of each of the two inclined surfaces is sufficiently thin so that laser light can permeate into said absorption layer, whereby the thickness of a semiconductor layer that constitutes a double-heterostructure is not required to be precisely regulated so that the laser device is not restricted by production conditions and mass-production.

6 Claims, 4 Drawing Sheets

FIG.5A
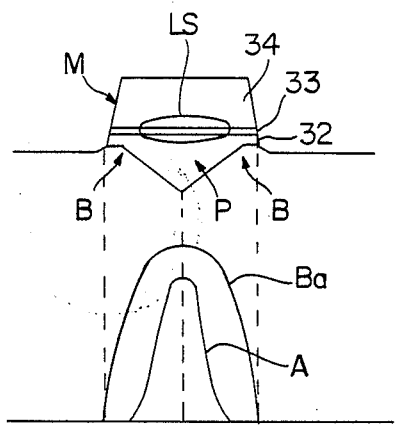
FIG.5B
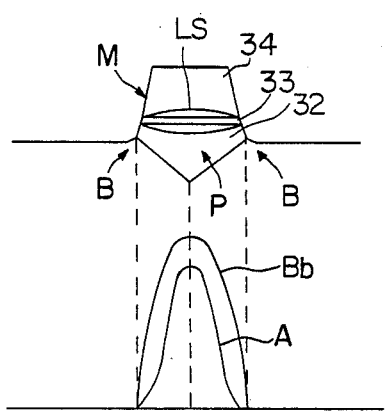
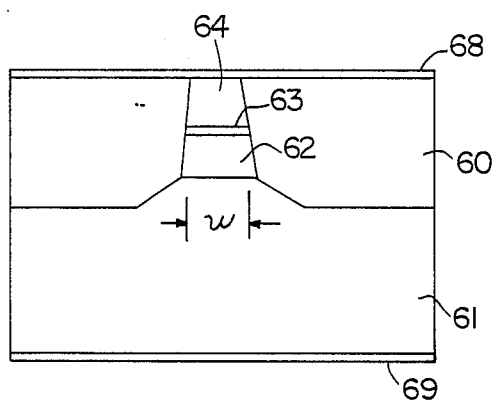
FIG.6A
PRIOR ART
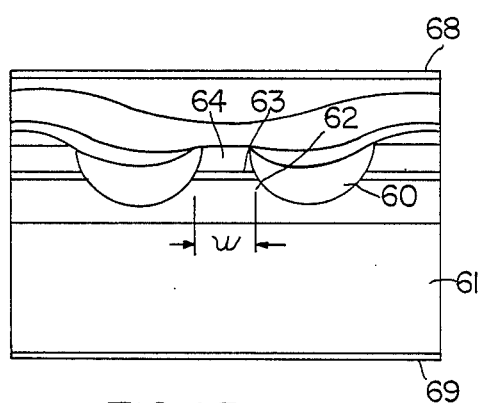
FIG.6B
PRIOR ART

SEMICONDUCTOR LASER DEVICE

BACKGROUND OF THE INVENTION

1. Field of the Invention

This invention relates to a semiconductor laser device with a double-heterostructure.

2. Description of the Prior Art

Conventional index-guided semiconductor laser devices with a striped structure include buried-type laser devices that have a low threshold current level. Typical examples of the buried-type laser devices are BH (buried heterostructure) lasers disclosed by, for example, Japanese Patent Publication Nos. 52-40958, 52-41107 and 52-48066 and DC-PBH (double-channel planar buried heterostructure) lasers disclosed by, for example, Japanese Patent Publication Nos. 62-2718 and 62-7719.

FIGS. 6A and 6B, respectively, show a BH laser and an InGaAsP/InP DC-PBH laser in which on a semiconductor substrate 61, a mesa stripe constituted by a cladding layer 62, an active layer 63 and a cladding layer 64 is disposed, and a burying layer 60 is disposed outside of the mesa. The reference numerals 68 and 69 indicate electrodes.

The above-mentioned buried-type laser devices with an index waveguide that is formed within the active layer 63 for laser oscillation are advantageous in that they oscillate laser light according to an index waveguiding operation and have a low threshold current of about 20 mA or less.

However, if a proper refractive index is not applied to the burying layer 60 made of a low refractive index semiconductor material, and if a proper width W is not applied to the waveguide that corresponds to the mesa, the laser devices will oscillate in a high-order transverse mode. As a result, laser light emitted from the device cannot be concentrated into a spot by any optical lens, which makes the practical use of the device inconvenient. To eliminate such a high-order transverse mode, it is necessary to narrow the mesa width W so as to be as small as 1–2 μm, which causes the laser-emitting face to break down even at a relatively low optical output power, and which causes difficulties in the production of the device, so that mass-production of the device cannot be attained and reliability of the device is decreased.

On the other hand, with the index guided laser devices, there are CSP (channeled substrate planar) laser devices that are disclosed by, for example, Japanese Patent Publication 54-5273. FIG. 7 shows a CSP laser device in which on an n-GaAs substrate 71 with a striped channel 77 that is formed into a rectangularity in section, an n-GaAlAs cladding layer 72, a GaAlAs active layer 73, a p-GaAlAs cladding layer 74, and an n-GaAs cap layer 75 are disposed in that order. A p-Zn diffusion layer 76 is disposed in the area from the cap layer 75 to the cladding layer 74 corresponding to the rectangular channel 77. The rectangular channel including both the shoulder portions S defines the borderline between the substrate 71 end the cladding layer 72. The thickness of the portions of the cladding layer 72 that are outside of the rectangular channel 77 is so thin that the laser light L produced in the active layer 73 can permeate into a absorption layer (i.e., the GaAs substrate 71), whereas the thickness of the portion that corresponds to the rectangular channel 77 is so thick that the laser light L cannot be absorbed into the absorption layer 71.

Thus, in the above-mentioned CSP laser device, the effective refractive index of the portion of the active layer 73 corresponding to the rectangular channel 77 becomes smaller than that of the portions of the active layer 73 corresponding to the outside of the rectangular channel 77, resulting in an index waveguide within the active layer 73. This laser device is also advantageous in that it tends to oscillate in a fundamental transverse mode because high-order transverse mode gain is suppressed by the phenomenon that the laser light from the portions of the active layers outside of the rectangular channels 77 is absorbed by the absorption layer 71 as mentioned above.

However, if the thickness of the portions of the cladding layer 72 corresponding to the outside of the rectangular channel 77 is thin in excess, the absorption of laser light in these areas will arise exceedingly, resulting in the emission of laser light with a low differential quantum efficiency. If the thickness of the cladding layer 72 corresponding to the outside of the rectangular channel 77 is thick in excess, the effective refractive-index difference $\Delta n$ of the optical waveguide will become small, which makes the transverse mode unstable. That is, the CSP laser device attains laser oscillation in a fundamental transverse mode, but the oscillation spot obtained shifts with an increase in an optical output power (i.e., with an increase in current to be injected). When the oscillation spot significantly shifts, as shown in FIG. 8, a kink K that is named an I-L kink occurs in the current-/optical output characteristic curve. This phenomenon is explained below: Since the laser oscillation spot LS permeates into the substrate 71 outside of the rectangular channel 77 as shown in FIG. 7, the differential quantum efficiency $\eta_d$ of the laser light varies depending upon the thickness of the cladding layer 72 outside of the rectangular channel 77; namely, when the thickness thereof is thin in excess, the differential quantum efficiency $\eta d$ becomes exceedingly small and when the thickness thereof is thick in excess so as to make the $\eta d$ great, the effective refractive-index difference $\Delta n$ of the optical waveguide becomes small so that the oscillation spot will shift at a certain optical output power and the kink K in the current/optical output power characteristic curve such as that shown in FIG. 8 will occur.

Accordingly, in order for the CSP laser device to attain oscillation in a stable fundamental transverse mode and to attain a satisfactory differential quantum efficiency, the thickness of the portions of the cladding layer 72 outside of the rectangular channel 77 must be precisely regulated. Although the CSP laser device with the above-mentioned rectangular channel having the shoulder portions S is produced by LPE (liquid phase epitaxy), LPE does not provide layers with a predetermined uniform thickness, so that the resulting CSP laser device has a low differential quantum efficiency and oscillates in an unstable transverse mode.

SUMMARY OF THE INVENTION

The semiconductor laser device of this invention, which overcomes the above-discussed and numerous other disadvantages and deficiencies of the prior art, comprises a double-heterostructure in which an active layer with a flat surface is sandwiched between a first semiconductor layer and a second semiconductor layer, the forbidden bandgap of each of said first and second semiconductor layers being larger than that of said active layer, wherein at least one of said first and second semiconductor layers has a striped projection provided with two inclined surfaces in the longitudinal direction; said semiconductor layer with said striped projection is sandwiched between said active layer and a light absorption layer for absorbing laser light; and the thickness of the portion of said semiconductor layer with said striped projection that corresponds to the inside of the center area of each of the two inclined surfaces of said projection is thick enough so that laser light cannot permeate into said absorption layer therethrough and the thickness of the portion of said semiconductor layer with said striped projection that corresponds to the outside of the center area of each of the two inclined surfaces of said projection is sufficiently thin so that laser light can permeate into said absorption layer therethrough.

In a preferred embodiment, the striped projection is shaped into a V-letter or trapezoid in section.

In a preferred embodiment, a current blocking layer is disposed on both sides of said striped projection, resulting in an inner striped structure, the conductivity type of said current blocking layer being different from that of said absorption layer.

In a preferred embodiment, the double-heterostructure is constituted by a striped mesa with a width that is wider than that of an optical waveguide of said active layer, the outside of said striped mesa being buried by burying layers with forbidden bandgaps that are larger than that of said active layer.

Thus, the invention described herein makes possible the objectives of (1) providing a semiconductor laser device in which the thickness of a semiconductor layer that constitutes a double-heterostructure is not required to be precisely regulated so that the laser device is not restricted by production conditions and mass-production; (2) providing a semiconductor laser device that attains laser oscillation in a stable fundamental transverse mode even at a high output power; (3) providing a semiconductor laser device that attains a high differential quantum efficiency; (4) providing a semiconductor laser device with a mesa stripe, the outside of which is buried by a burying layer with a forbidden band width that is greater than that of the active layer, which makes the threshold current level low; and (5) providing a semiconductor laser device with the above-mentioned mesa stripe that is buried by the burying layer, in which laser light does not permeate into the burying layer, which makes the life of the laser device long.

BRIEF DESCRIPTION OF THE DRAWINGS

This invention may be better understood and its numerous objects and advantages will become apparent to those skilled in the art by reference to the accompanying drawings as follows:

FIG. 5A is of a graph showing the distribution of laser light and the distribution of carrier within the active layer of the semiconductor laser device shown in FIG. 3A.

FIG. 5B is of a graph showing the distribution of laser light and the distribution of carrier within the active layer of the semiconductor laser device of this invention in which the width of the mesa stripe is approximately equal to that of the striped channel.

FIGS. 6A and 6B, respectively, are front sectional views showing conventional buried-type (BH) laser devices.

DESCRIPTION OF THE PREFERRED EMBODIMENTS

Figure 1A:
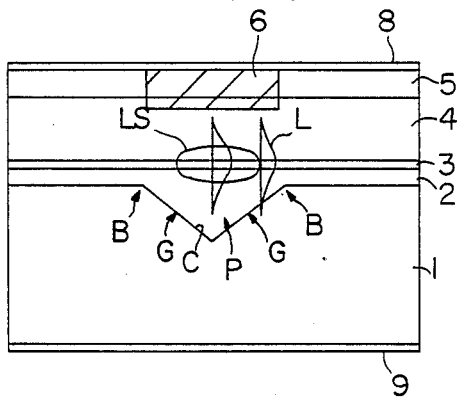
FIG. 1A is a front sectional view showing a semiconductor laser device of this invention.

This invention provides a semiconductor laser device in which at least one of the semiconductor layers that sandwich the active layer therebetween has a V- or trapezoid-shaped projection. Laser light from the portions of the active layer corresponding to the outside of the center area of the projection permeates into an absorption layer via the two surfaces inclined of the said projection, whereas laser light from the portion of the active layer corresponding to the inside of the center area of the projection is waveguided without being absorbed by the absorption layer. Accordingly, neither the amount of laser light to be absorbed by the absorption layer nor the effective refractive-index difference depends upon the thickness of the portion of the semiconductor layer that is positioned outside of the projection, but it depends upon changes in the thickness of the portions of the semiconductor layer that is positioned at the two inclined surfaces of the said projection, so that the effective refractive-index difference in that forms an index waveguide within the active layer does not vary stepwise but it varies continuously, which makes it possible to confine within the said waveguide the laser light in the portion of the active layer corresponding to the inside of the center area of the projection. That is, the said optical waveguide is not formed by the shoulder portions of a rectangulality, but it is formed by the inclined surfaces of a V- or trapezoid-shaped projection, and a laser oscillation spot is formed inside of the center area of the projection. In this way, according to the semiconductor laser device of this invention, the permeation of the laser light forming a spot into the outside of the projection of the semiconductor laser can be prevented to a large extent so that the thickness of the said semiconductor layer can be reduced. Moreover, the distance from the active layer to the absorption layer in the areas of the said semiconductor layer that are positioned outside of the laser oscillation spot is still longer than that from the active layer to the absorption layer in the areas of the said semiconductor layer that are positioned outside of the projection, so that the amount of laser light to be absorbed by the absorption layer becomes little.

As mentioned above, with the semiconductor laser device of this invention, the laser oscillation spot does not permeate into the outside of the projection so that the differential quantum efficiency ηd does not depend upon the thickness of the portions of the said semiconductor layer outside of the projection. An optical waveguide is formed by the distribution of an effective refractive-index difference that is created by the distribution of the thickness of the said semiconductor layer positioned on the inclined surfaces of the projection, and the laser light outside of the optical waveguide is absorbed by the absorption layer, so that laser oscillation in a stable fundamental transverse mode can be maintained. Moreover, because the projection has the two inclined surfaces in the longitudinal direction, the width of the laser oscillation spot can be selected at a desired level so as to minimize the absorption of light by the absorption layer.

The semiconductor laser device of this invention stably provides a differential quantum efficiency ηd of as high as about 40–50%, whereas the differential quantum efficiency ηd of the conventional CSP laser device is about 25%. Moreover, in the semiconductor laser device of this invention, neither the shift of the laser oscillation spot nor the I-L kink is not observed up to an optical output of as high as about 40 mW.

EXAMPLE 1

FIG. 1A shows a semiconductor laser device of this invention, which is produced as follows: a striped channel C with a width of 4 μm and a depth of 1 μm is formed in an n-GaAs substrate 1 by a chemical etching technique. The striped channel C is shaped into a V-shape in section. On the substrate 1 with the V-shaped channel C, an n-GaAlAs cladding layer 2 with a thickness of 0.1 μm in the flat portion thereof, a GaAlAs active layer 3, a p-GaAlAs cladding layer 4, and an n-GaAs cap layer 5 are successively formed by LPE, followed by forming a p-Zn diffusion layer 6 in a region ranging from the cap layer 5 to the cladding layer 4 corresponding to the V-shaped channel C to thereby confine current therein. The reference numerals 8 and 9 indicate electrodes. The cladding layer 2 has a V-shaped projection P because it is formed on the substrate 1 with the V-shaped channel C. The surface of the active layer 3 becomes flat because of the characteristics of the liquid phase epitaxial growth.

Laser light L permeates from the active layer 3 into the absorption layer (i.e., the GaAs substrate 1) via the portion of the cladding layer 2 outside of the center area G of each of the two inclined surfaces of the projection P. The amount of laser light L to be absorbed by the absorption layer 1 decreases with an increase in the thickness of the said portion of the cladding layer 2. The thickness of the cladding layer 2 corresponding to the inside of the center area of the projection P (that is in the range of one point "G" to another point "G") is so thick that laser light L from the active layer 3 corresponding thereto cannot be absorbed by the absorption layer 1. In this way, both the amount of laser light L to be absorbed by the GaAs substrate 1 and the effective refractive-index difference continuously vary in the transverse direction in accordance with the slope of the two surfaces of the projection P. Laser light that is generated in the active layer 3 corresponding to the area ranging from point "G" to point "G" of the inclined surfaces of the projection P is confined within an optical waveguide that is formed within the active layer 3 by the effective refractive-index difference. The laser oscillation spot LS is formed in the area of the active layer 3 corresponding to the inside of the projection P (that is defined by points B). The distribution of laser light generated in this semiconductor laser device is shown by curve A of FIG. 4, indicating that the width of the laser oscillation spot LS is narrower than that of the projection P or the V-shaped channel C (i.e., the distance between the points B). Curve B1 shows the distribution of the carrier (i.e., electrons and positive holes) within the active layer 3.

EXAMPLE 2

Figure 1B:
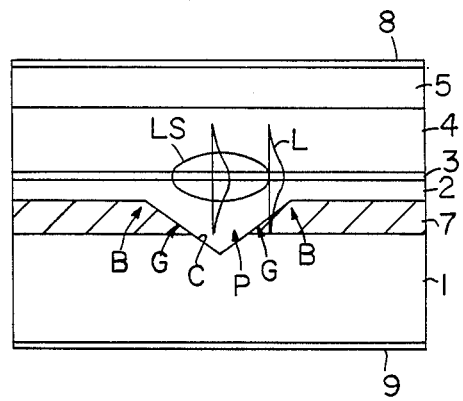
FIG. 1B is a front sectional view showing another semiconductor laser device of this invention.

FIG. 1B shows another semiconductor laser device of this invention which is produced as follows:
An n-GaAs current blocking layer 7 with a thickness of about 0.8 μm is formed on a p-GaAs substrate 1, and a striped channel C with a width of 4 μm and a depth of 1 μm is formed so that it reaches the substrate 1 through the current blocking layer 7. The striped channel C is formed into a V-shaped in section. On the current blocking layer 7 including the V-shaped channel C, a p-GaAlAs cladding layer 2 with a thickness of 0.1 μm in the flat portion thereof, a GaAlAs active layer 3, an n-GaAlAs cladding layer 4, and an n-GaAs cap layer 5 are successively formed by LPE, resulting in an inner stripe structure. In the laser device of this example, as well, laser light L in the active layer 3 corresponding to the area positioned between the points G of the inclined surfaces of the projection P is confined within an optical waveguide that is formed within the active layer 3. The laser oscillation spot LS is formed in the area of the active layer 3 corresponding to the inside of the projection P, as well.

EXAMPLE 3

Figure 2A:
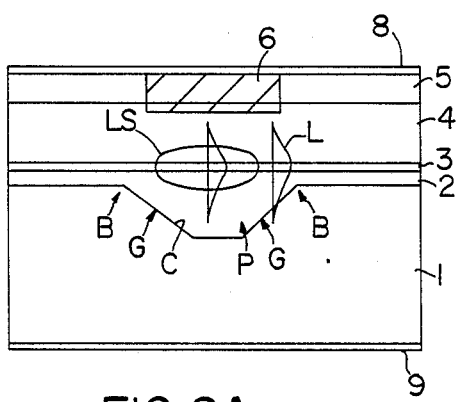
FIG. 2A is a front sectional view showing another semiconductor laser device of this invention.

FIG. 2A shows another semiconductor laser device of this invention, the structure of which is the same as that of the laser device of Example 1 shown in FIG. 1A, except that the striped channel C and the projection P are shaped into a trapezoid, having an upside length of 6 μm, a downside length of 2 μm, and a height of 1 μm, in section. The trapezoid-shaped projection P provides an optical waveguide width (i.e., a laser oscillation spot LS width) that is wider than the optical waveguide that is provided by a V-shaped projection.

EXAMPLE 4

Figure 2B:
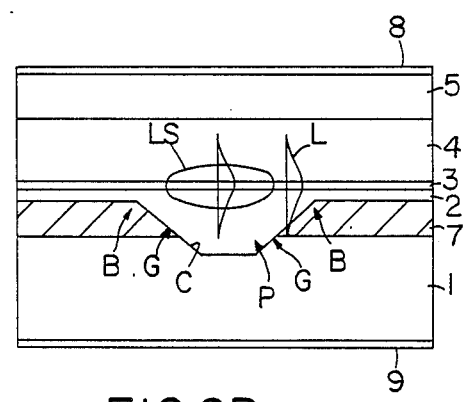
FIG. 2B is a front sectional view showing another semiconductor laser device of this invention.

FIG. 2B shows another semiconductor laser device of this invention, the structure of which is the same as that of Example 2 shown in FIG. 1B, except that the striped channel C and the projection P are shaped into a trapezoid, having an upside length of 6 μm, a downside length of 2 μm, and a height of 1 μm, in section. The trapezoid-shaped projection P provides an optical waveguide width (i.e., a laser oscillation spot LS width) that is wider than the optical waveguide that is provided by a V-shaped projection.

EXAMPLE 5

Figure 3A:
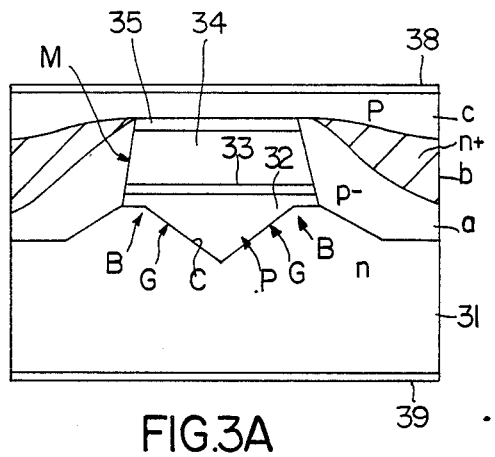
FIG. 3A is a front sectional view showing another semiconductor laser device of this invention.

FIG. 3A shows another semiconductor laser device of this invention, which is produced as follows: A V-shaped striped-channel C with a width of 4 μm and a depth of 1 μm is formed in an n-GaAs substrate 31 by a chemical etching technique. Then, on the substrate 31 with the V-shaped channel C, an n-GaAlAs cladding layer 32 with a thickness of 1 μm in the flat portion thereof, a GaAlAs active layer 33, a p-GaAlAs cladding layer 34, and a p-GaAlAs cover layer 35 are successively formed by LPE. Then, a striped mesa M with a width that is wider than the width of the projection P of the cladding layer 32 by about 1 μm is formed by the removal of the areas outside of the said striped mesa M by means of a chemical etching technique. Thereafter, the outside of the striped mesa M is buried with a p⁻-GaAlAs high-resistance layer a, an n⁺-GaAlAs current blocking layer b, and an n-GaAs cap layer c by means of LPE. The cap layer c is also formed on the top of the mesa M. The reference numerals 38 and 39 indicate electrodes. The semiconductor laser device of this example can attain laser oscillation at a threshold current level that is lower than that of the laser device of any of Examples 1-4.

EXAMPLE 6

Figure 3B:
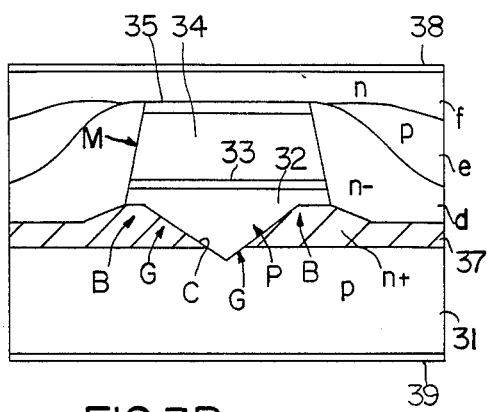
FIG. 3B is a front sectional view showing another semiconductor laser device of this invention.

FIG. 3B shows another semiconductor laser device of this invention, which is produced as follows: An n⁺-GaAs current blocking layer 37 with a thickness of about 0.8 μm is formed on a p-GaAs substrate 31. Then, a V-shaped striped-channel C with a width of 4 m and a depth of 1 μm is formed so that it reaches the substrate 31 through the current blocking layer 37. Then, on the current blocking layer 37 including the V-shaped channel C, a p-GaAlAs cladding layer 32, a GaAlAs active layer 33, an n-GaAlAs cladding layer 34, and an n-GaAlAs cover layer 35 are successively formed by LPE, after which a striped mesa M with a width that is wider than that of the V-shaped channel C (i.e., the projection P) by about 1 μm is formed by the removal of the areas outside of the said striped mesa M by means of a chemical etching technique. Then, the outside of the striped mesa M is buried with an n⁻-GaAlAs high resistance layer d, a p-GaAlAs current blocking layer e, and an n-GaAs cap layer f by means of LPE. The cap layer f is also formed on the top of the mesa M. The laser device of this example can attain laser oscillation at a threshold current level that is lower than that of the laser device of any of Examples 1-4, as well.

The distribution of laser light of the semi-conductor laser device of each of Examples 5 and 6 is shown by curve A of FIG. 5A, indicating that the width of the laser oscillation spot LS is narrower than that of the projection P (i.e., the V-shaped channel C). Curve Ba of FIG. 5A shows the distribution of carrier within the active layer 33. FIG. 5B shows the distribution of laser light (curve A) and the distribution of carrier (curve Bb) in the case where the width of the mesa M is approximately equal to that of the projection P.

Figure 4:
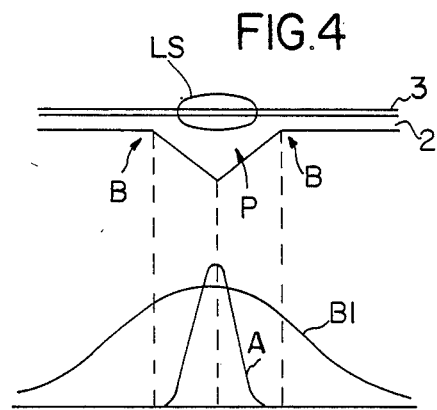
FIG. 4 is of a graph showing the distribution of laser light and the distribution of carrier within the active layer of the semiconductor laser device shown in FIG. 1A.
Figure 7:
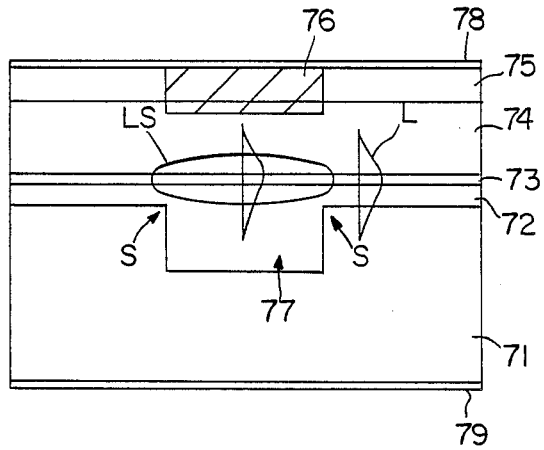
FIG. 7 is a front sectional view showing a conventional CSP laser device.
Figure 8:
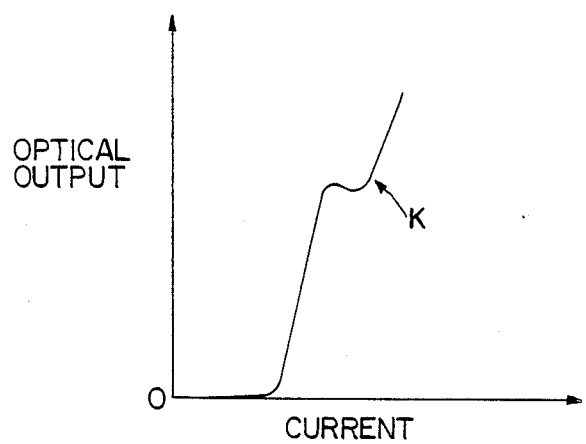
FIG. 8 is of a graph showing the current/optical output power characteristics of the conventional CSP laser device shown in FIG. 7.

With the laser device of Example 1 (FIG. 1A), as shown in FIG. 4, the distribution of the carrier within the active layer 3 (curve B1) spreads over two times or more of the width of the projection P. This means that the amount of carrier to be used for laser oscillation within the active layer 3 in the inside of the projection P will be one half time or less the total amount of carrier within the active layer 3. In contrast, the laser devices of Examples 5 and 6 have a striped mesa M including the active layer 33 in the vicinity of the projection P. The width of the mesa M is wider than that of the laser oscillation spot and the outside of the mesa M is buried with GaAlAs semiconductor materials, the forbidden bandgap of which is larger than that of the active layer 33. As shown in FIGS. 5A and 5B, the distribution of carrier within the active layer 33 is confined within the mesa M so that the total amount of carrier within the active layer 33 can contribute to laser oscillation, thereby attaining a significant decrease in the threshold current level. Table 1 shows that the threshold current of each of the laser devices of Examples 5 and 6 is about one half that of the laser device of Example 1. Moreover, notwithstanding the laser devices of Examples 5 and 6, both are a kind of buried-type lasers, deterioration in the vicinity of the sides of the striped mesa is not observed. This is because the optical waveguide is positioned within the mesa M, the outside of which is buried with burying layers (that is, the width of the optical waveguide in the active layer 33 is significantly narrower than that of the mesa M).

The characteristics of the semiconductor laser devices of the above-mentioned examples are shown in Table 1.

TABLE 1

|  |  | Wavelength (nm) | Threshold current (mA) | Differential quantum efficiency (%) |
| --- | --- | --- | --- | --- |
| Example 1 | FIG. 1A | 780 | 60 | 40 |
| Example 2 | FIG. 1B | 780 | 35 | 45 |
| Example 3 | FIG. 2A | 830 | 70 | 45 |
| Example 4 | FIG. 2B | 830 | 45 | 50 |
| Example 5 | FIG. 3A | 780 | 25 | 40 |
| Example 6 | FIG. 3B | 780 | 20 | 45 |

Although each of the above-mentioned examples only disclose a laser device that has a projection P in the semiconductor layer on the substrate side, the projection P can be provided in a semiconductor layer positioned opposite to the substrate. The projection P can be also provided in each of these semiconductor layers. Moreover, this invention is not limited to the above-mentioned GaAs/GaAlAs system, but it is, of course, applicable to the InP/InGaAsP system and other heterojunction semiconductor laser devices.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device, the combination of a double-heterostructure in which an active layer with a flat surface is sandwiched between a first semiconductor layer and a second semiconductor layer, the forbidden bandgap of each of said first and second semiconductor layers being larger than that of said active layer, wherein at least one of said first and second semiconductor layers has a striped projection provided with two inclined surfaces in the longitudinal direction; said semiconductor layer with said striped projection is sandwiched between said active layer and a light absorption layer for absorbing laser light; and the thickness of the portion of said semiconductor layer with said striped projection that corresponds to the inside of the center area of each of two inclined surfaces of said projection is thick enough so that laser light cannot permeate into said absorption layer therethrough and the thickness of the portion of said semiconductor layer with said striped projection that corresponds to the outside of the center area of each of the two inclined surfaces of said projection is sufficiently thin so that laser light can permeate into said absorption layer therethrough.

2. A device according to claim 1, wherein said striped projection is shaped into a V-letter in section.

3. A device according to claim 1, wherein said striped projection is shaped into a trapezoid.

4. A device according to claim 1, in which a current blocking layer is disposed on both sides of said striped projection, resulting in an inner stripe structure, the conductivity type of said current blocking layer being different from that of said absorption layer.

5. In a semiconductor laser device, the combination of a double-heterostructure in which an active layer with a flat surface is sandwiched between a first semiconductor layer and a second semiconductor layer, the forbidden bandgap of each of said first and second semiconductor layers being larger than that of said active layer, wherein at least one of said first and second semiconductor layers has a striped projection provided with two inclined surfaces in the longitudinal direction; said semiconductor layer with said striped projection is sandwiched between said active layer and a light absorption layer for absorbing laser light; and the thickness of the portion of said semiconductor layer with said striped projection that corresponds to the inside of the center area of each of the two inclined surfaces of said projection is thick enough so that laser light cannot permeate into said absorption layer therethrough and the thickness of the portion of said semiconductor layer with said striped projection that corresponds to the outside of the center area of each of the two inclined surfaces of said projection is sufficiently thin so that laser light can permeate into said absorption layer therethrough;

in which said double-heterostructure is constituted be a striped mesa with a width that is wider than that of an optical waveguide of said active layer, the outside of said striped mesa being buried by burying layers with forbidden bandgaps that are larger than that of said active layer.

6. In a semiconductor laser device, the combination of a double-heterostructure in which an active layer with a flat surface is sandwiched between a first semiconductor layer and a second semiconductor layer, the forbidden bandgap of each of said first and second semiconductor layers being larger than that of said active layer, wherein at least one of said first and second semiconductor layers has a striped projection provided with two inclined surfaces in the longitudinal direction; said semiconductor layer with said striped projection is sandwiched between said active layer and a light absorption layer for absorbing laser light; and the thickness of the portion of said semiconductor layer with said striped projection that corresponds to the inside of the center area of each of the two inclined surface of said projection is thick enough so that laser light cannot permeate into said absorption layer therethrough and the thickness of the portion of said semiconductor layer with said striped projection that corresponds to the outside of the center area of each of the two inclined surfaces of said projection is sufficiently thin so that laser light can permeate into said absorption layer therethrough;

in which a current blocking layer is disposed on both sides of said striped projection, resulting in an inner stripe structure, the conductivity type of said current blocking layer being different from that of said absorption layer.

* * * * *